US009906171B2

(12) United States Patent
Chen et al.

(10) Patent No.: US 9,906,171 B2
(45) Date of Patent: Feb. 27, 2018

(54) PIEZOELECTRIC ENERGY HARVESTING APPARATUS

(71) Applicant: Tainan Hydraulics Laboratory, National Cheng Kung University, Tainan (TW)

(72) Inventors: Yang-Yih Chen, Wandan Township, Pingtung County (TW); Ray-Yeng Yang, Tainan (TW); Chia-Che Wu, Taichung (TW); Jenn-Ming Song, Taipei (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 15/281,933

(22) Filed: Sep. 30, 2016

(65) Prior Publication Data
US 2017/0170751 A1     Jun. 15, 2017

(30) Foreign Application Priority Data

Dec. 11, 2015   (TW) .............................. 104141811 A

(51) Int. Cl.
*H01L 41/113*        (2006.01)
*H02N 2/18*          (2006.01)

(52) U.S. Cl.
CPC .................................. *H02N 2/186* (2013.01)

(58) Field of Classification Search
CPC ................................. H02N 2/18; H01L 41/113
USPC ............................................................ 310/339
See application file for complete search history.

(56) References Cited

U.S. PATENT DOCUMENTS

| 2011/0204751 A1* | 8/2011 | Rastegar | H02N 2/186 310/339 |
| 2016/0072411 A1* | 3/2016 | Mihara | H02N 2/18 318/116 |

FOREIGN PATENT DOCUMENTS

| JP | 2010074966 A | * | 4/2010 | ............. B60G 11/02 |
| WO | WO 2004015790 A1 | * | 2/2004 | ............... F03G 7/08 |
| WO | WO 2012088271 A2 | * | 6/2012 | ........... H10L 41/125 |

* cited by examiner

*Primary Examiner* — J. San Martin
(74) *Attorney, Agent, or Firm* — Muncy, Geissler, Olds & Lowe, P.C.

(57) ABSTRACT

A piezoelectric energy harvesting apparatus includes a housing and a piezoelectric module disposed in the housing. The piezoelectric module includes a piezoelectric wafer unit and a clamp unit clamping the piezoelectric wafer unit. A resilient member is connected between the clamp unit and an inner wall of the housing to transmit an oscillation movement to the clamp unit, which in turn causes oscillation of the piezoelectric wafer unit for generating an electric power. An impact unit extends movably into the housing and is capable of pushing the clamp unit against the resilient member when being subjected to an ambient natural force such that the resilient member generates the oscillation movement.

8 Claims, 7 Drawing Sheets

PIEZOELECTRIC ENERGY HARVESTING APPARATUS

CROSS-REFERENCE TO RELATED APPLICATION

This application claims priority to Taiwanese Patent Application No. 104141811, filed on Dec. 11, 2015.

FIELD

The disclosure relates to an energy harvesting apparatus, and more particularly to a piezoelectric energy harvesting apparatus.

BACKGROUND

With the growing awareness of environmental protection, many countries are dedicated to development of an environmentally clean energy source, such as wind/solar electric power generation. In addition, because the majority of the earth surface is covered by oceans, ocean wave energy is also utilized as a source of mechanical energy. However, although the techniques of ocean wave or wind electricity generation have been popularly developed, the facilities to utilize the ocean or wind wave energy for generating an electric power are expensive and bulky.

SUMMARY

Therefore, an object of the disclosure is to provide a piezoelectric energy harvesting apparatus that can be easily manufactured for generating electricity by utilizing natural energy resources, such as ocean wave energy, wind energy, etc.

According to the disclosure, a piezoelectric energy harvesting apparatus includes a housing, a piezoelectric module, a resilient member and an impact unit.

The housing defines an installation space.

The piezoelectric module is disposed in the installation space, and includes at least one piezoelectric wafer unit and a clamp unit. The piezoelectric wafer unit includes a piezoelectric wafer, and two electric power output electrodes respectively and electrically coated on two opposite surfaces of the piezoelectric wafer. The clamp unit clamps the piezoelectric wafer unit, and is movably disposed inside the installation space.

The resilient member is connected between the clamp unit and an inner wall of the housing within the installation space. The resilient member resiliently hangs the clamp unit to transmit an oscillation movement to the clamp unit, which in turn causes oscillation of the piezoelectric wafer unit for generating an electric power.

The impact unit movably extends into the installation space and is partially exposed from the housing. The impact unit is capable of pushing the clamp unit against the resilient member when being subjected to an ambient natural force such that the resilient member generates the oscillation movement.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
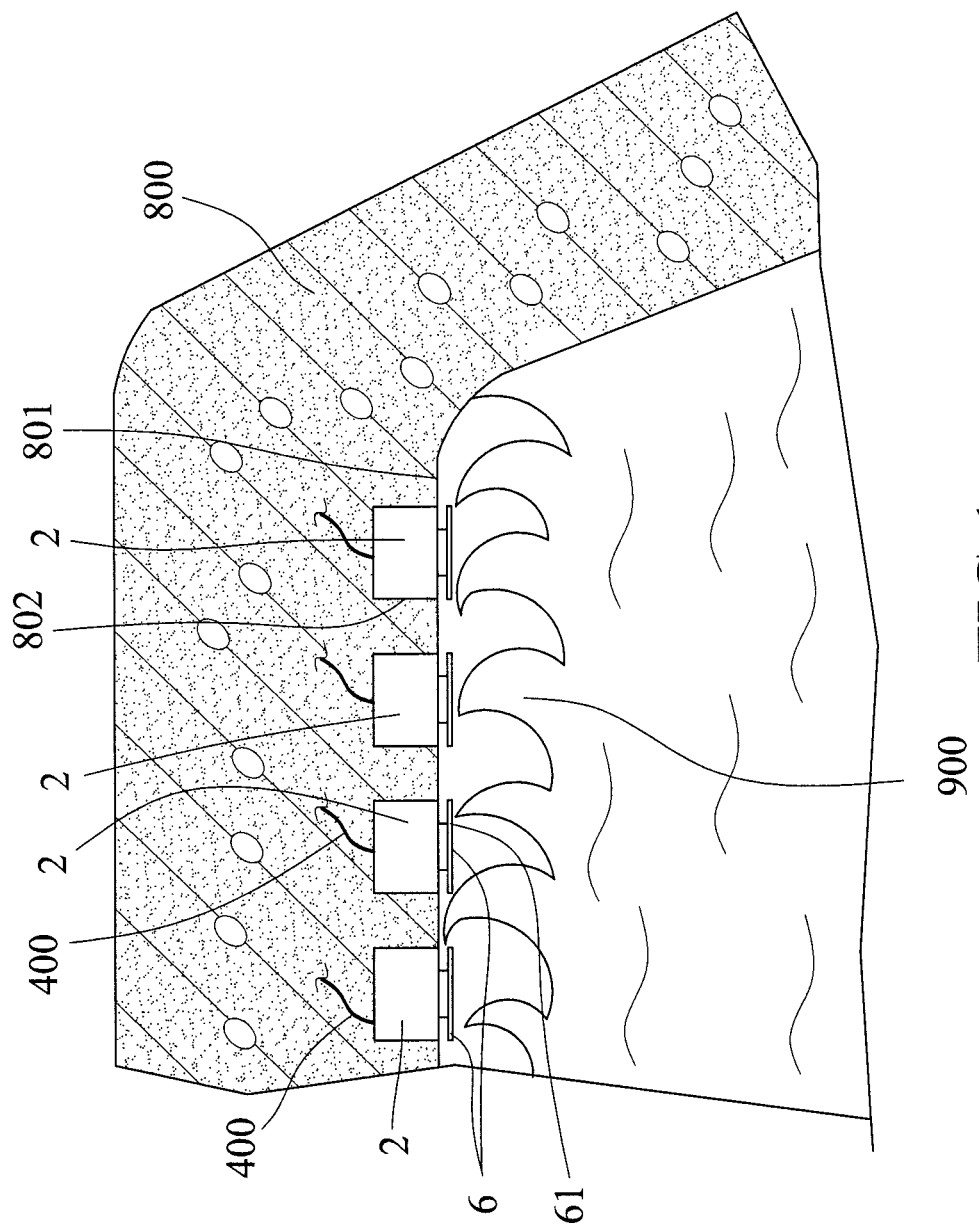
FIG. 1 is a fragmentary sectional view of a plurality of piezoelectric energy harvesting apparatuses according to an embodiment of the present disclosure in a use state.
Figure 2:
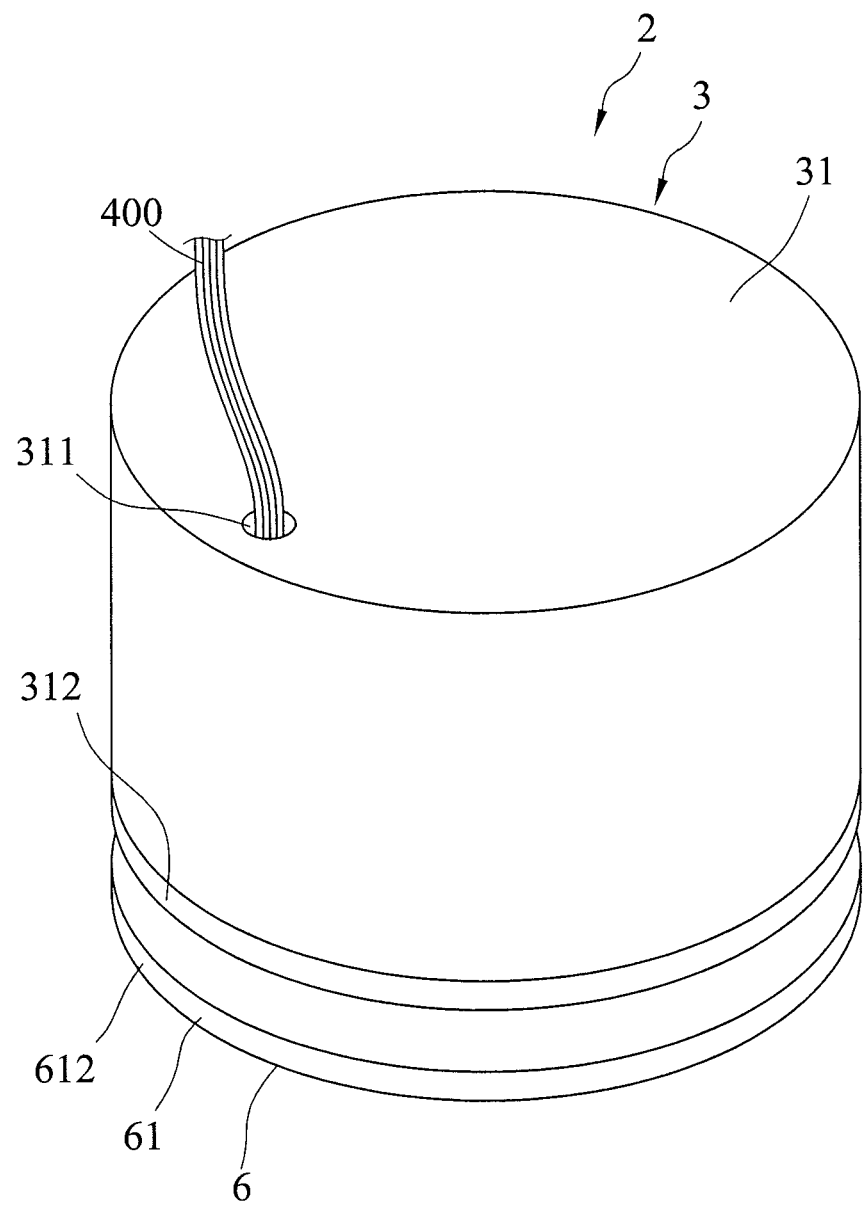
FIG. 2 is a perspective view illustrating one of the piezoelectric energy harvesting apparatuses shown in FIG. 1.
Figure 3:
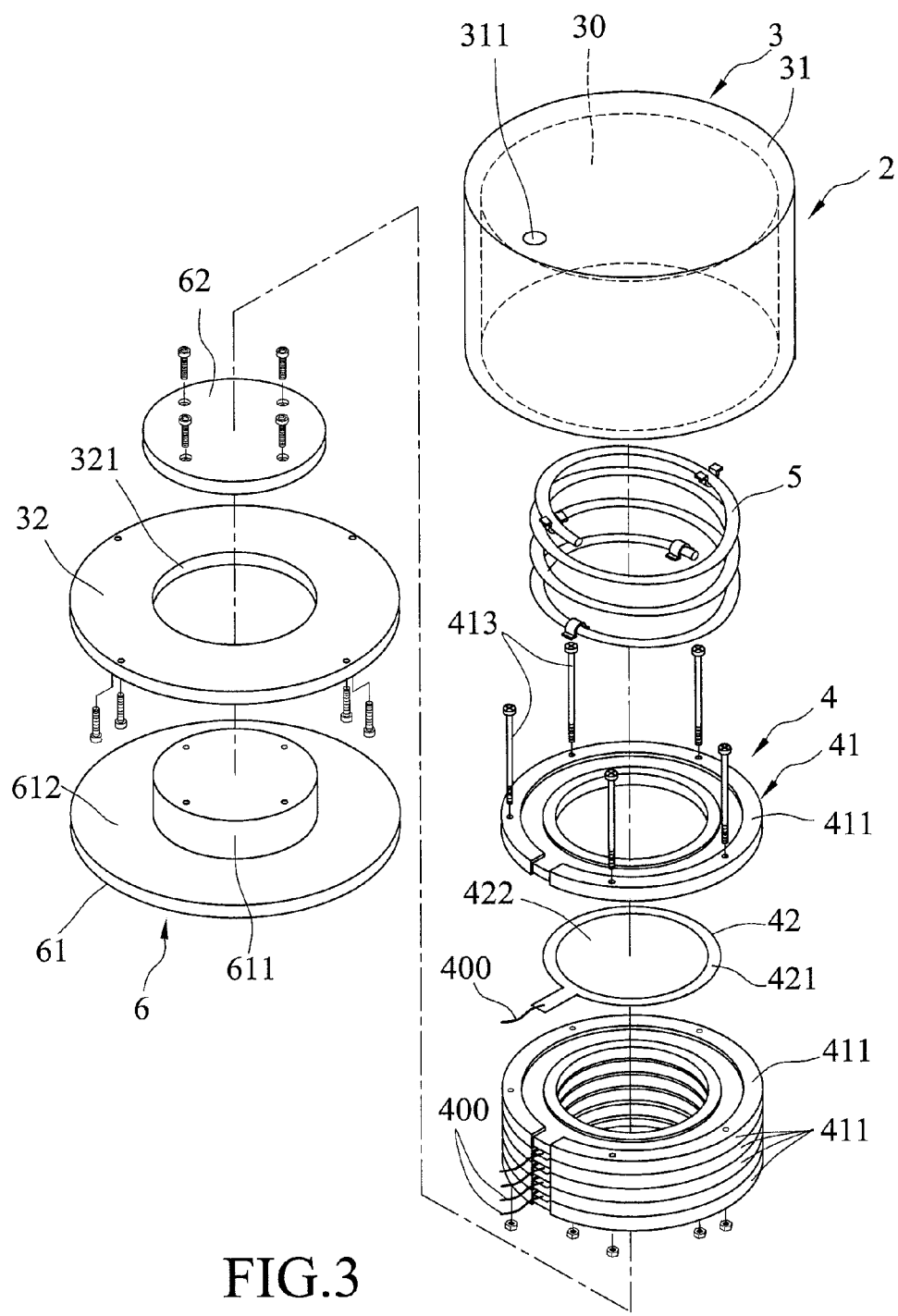
FIG. 3 is an exploded perspective view of the piezoelectric energy harvesting apparatus of FIG. 2.
Figure 4:
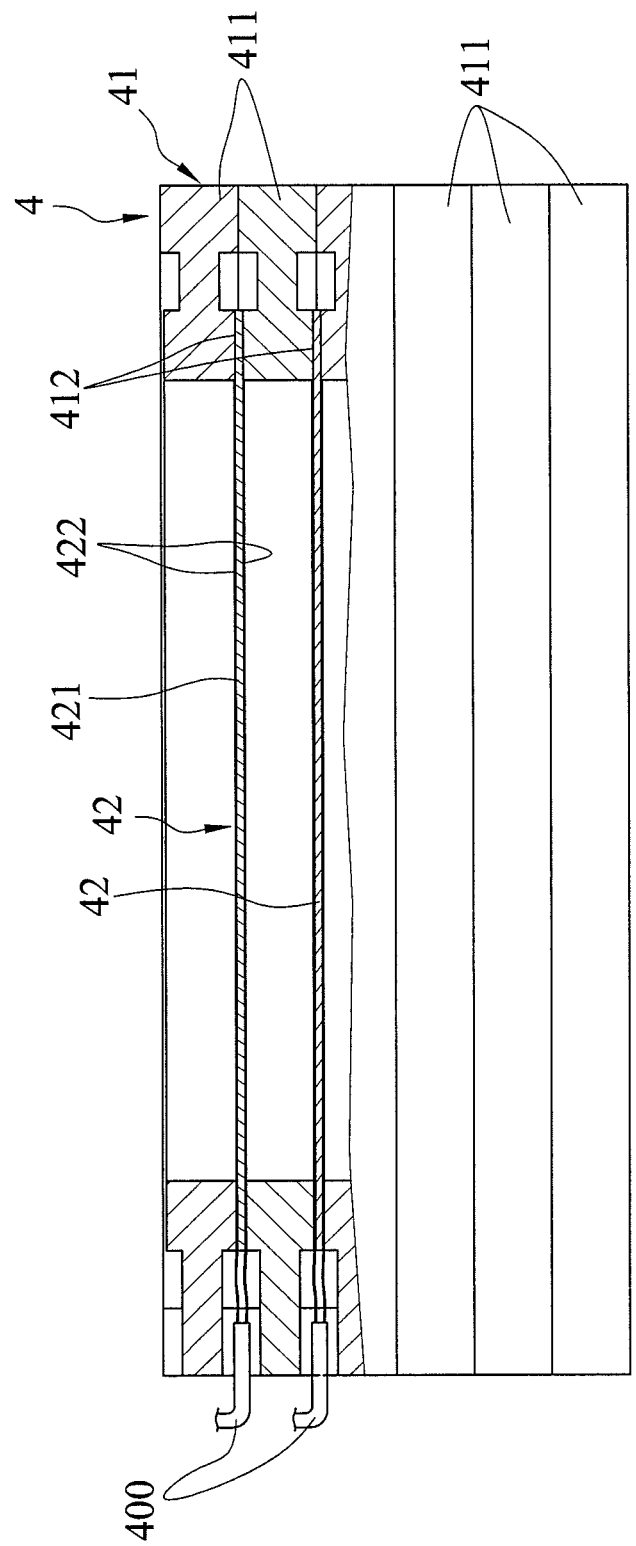
FIG. 4 is a partially sectioned view of the piezoelectric energy harvesting apparatus of FIG. 2.

Referring to FIGS. 1 to 5, a plurality of piezoelectric energy harvesting apparatuses 2 according to an embodiment of the present disclosure are installed on a coastal embankment 800 for harvesting energy from ocean waves 900 or wind to generate an electric power. The coastal embankment 800 has a wave-confronting surface 801 located above a sea level so as to receive impacts from ocean waves 900. The piezoelectric energy harvesting apparatuses 2 are deployed on the wave-confronting surface 801 and are electrically coupled to a power storage device (not shown) for storing the electric power generated by the piezoelectric energy harvesting apparatuses 2.

Each piezoelectric energy harvesting apparatus 2 includes a housing 3, a piezoelectric module 4, a resilient member 5 and an impact unit 6.

The housing 3 includes a hollow main body 31, and a bottom cover 32 threadedly secured to the main body 31 and covering a bottom opening of the main body 31. The main body 31 and the bottom cover 32 cooperatively define an installation space 30. A top end of the main body 31 has a vent hole 311 to vent air and to allow passage of a conductive wire 400. The bottom cover 32 (i.e. the bottom of the housing 3) has a through hole 321 communicating with the installation space 30.

The piezoelectric module 4 is disposed in the installation space 30, and includes a plurality of piezoelectric wafer units 42 and a clamp unit 41 clamping the piezoelectric wafer units 42 and movably disposed inside the installation space 30. In this embodiment, the piezoelectric wafer units 42 are spaced apart from each other along a top-bottom direction, and the clamp unit 41 is movable upward and downward in the installation space 30. The clamp unit 41 includes a plurality of clamping rings 411 stacked on each other and a plurality of fasteners 413 securing the clamping rings 411 together. Each of the piezoelectric wafer units 42 is clamped between each two adjacent ones of the clamp rings 411. Each two adjacent ones of the clamping rings 411 cooperatively define an annular clamping recess 412 therebetween to receive and position one of the piezoelectric wafer units 42.

Each piezoelectric wafer unit 42 includes a piezoelectric wafer 421 made from a piezoelectric material, and two electric power output electrodes 422 respectively and electrically coated on top and bottom surfaces of the piezoelectric wafer 421. The piezoelectric wafer 421 can be actuated to oscillate for generating an electric power. The electric power output electrodes 422 can output the electric power generated by oscillation of the piezoelectric wafer 421. In this embodiment, the conductive wires 400 are electrically coupled to the electric power output electrodes 422 of the piezoelectric wafers 421 and extend upwardly and outwardly from the housing 3 through the vent hole 311 for electrical connection with the power storage device. As such, the power storage device can store the electric power generated from the piezoelectric wafers 421.

In this embodiment, the piezoelectric wafer 421 is made from the piezoelectric material selected from the group consisting of a monocrystalline piezoelectric material, a polycrydtalline material, a polymeric piezoelectric material, and the combinations thereof. The monocrystalline piezoelectric material may be quartz, rochelle salt, lithium sulfate, or lithium niobate. The polycrydtalline material may be lead zirconate titanate (PZT), barium titanate, or zinc oxide. The polymeric piezoelectric material may be polyvinylidene fluoride (PVDF).

Figure 5:
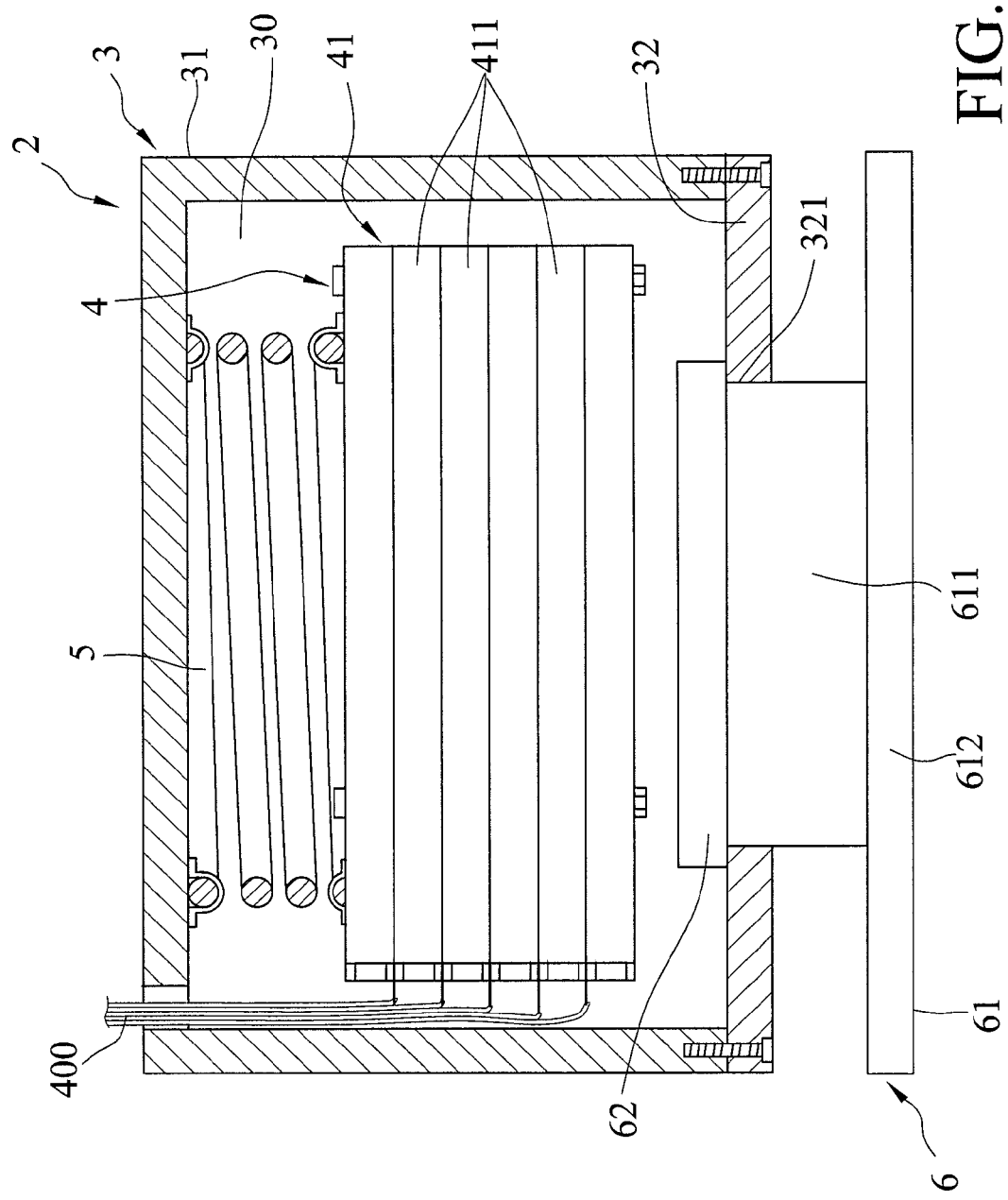
FIG. 5 is a sectional view of the piezoelectric energy harvesting apparatus of FIG. 2 illustrating an impact unit in a non-impacting position.
Figure 6:
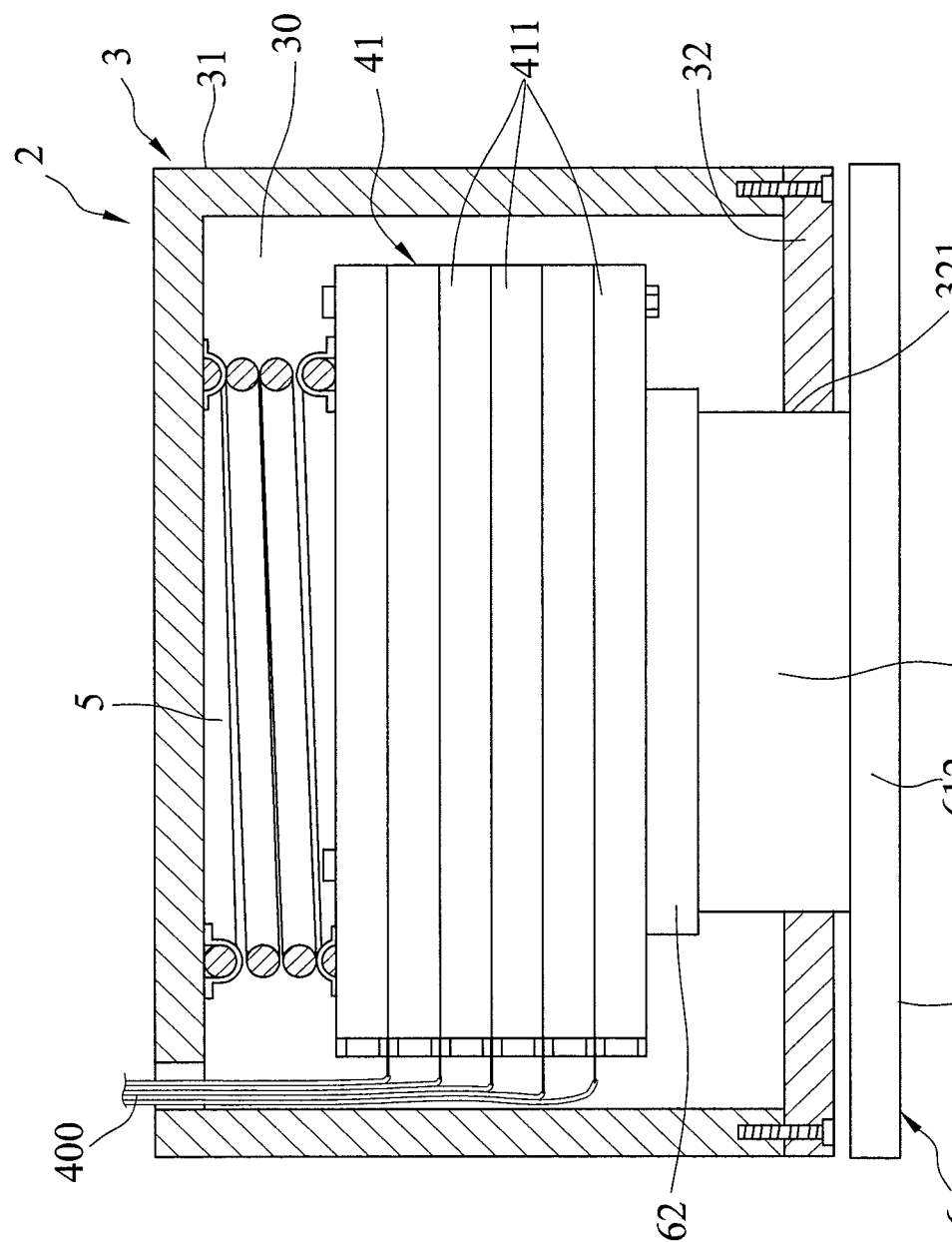
FIG. 6 is the same view as FIG. 5, but showing the impact unit in an impacting position.
Figure 7:
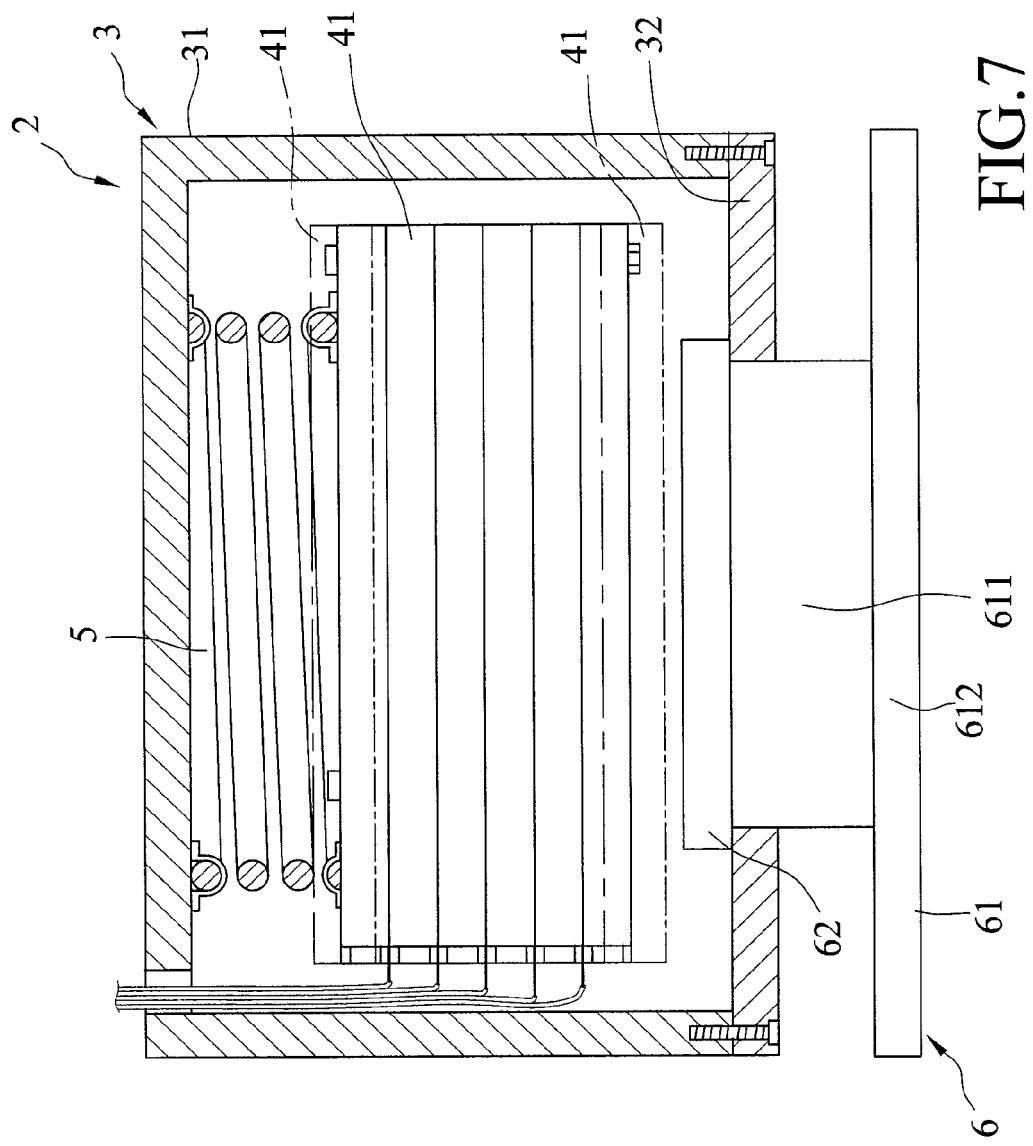
FIG. 7 is the same view as FIG. 5 but showing a piezoelectric module in an oscillation state.

Referring to FIGS. 6 and 7, in combination with FIG. 5, the resilient member 5 is connected between the clamp unit 41 and an inner wall of the main body 31 within the installation space 30. As such, the resilient member 5 is compressible and extendable between the inner wall of the main body 31 and the clamp unit 41. A top end of the resilient member 5 is fixed on the inner wall of the main body 31, and a bottom end of the resilient member 5 is fixed on a top end of the clamping rings 411. Accordingly, the resilient member 5 resiliently hangs the clamp unit 41. In this embodiment, the resilient member 5 is a helical spring. When the clamp unit 41 is pushed upwardly against the resilient member 5, the resilient member 5 is compressed upward to the inner wall of the main body 31.

The impact unit 6 movably extends into the installation space 30 and partially exposed from the bottom cover 32 of the main body 31. The impact unit 6 includes an impact receiving member 61 extending movably into the through hole 321, and a hitting plate 62 that is threadedly fixed on top of the impact receiving member 61 and that is limited within the installation space 30 for hitting the clamp unit 41. The impact receiving member 61 has a spindle portion 611 and an impact receiving plate 612. The spindle portion 611 extends movably through the through hole 321. The impact receiving plate 612 radially and outwardly extends from a bottom end of the spindle portion 611 and is wider than the spindle portion 611. The hitting plate 62 is fixed to a top end of the spindle portion 611 and has a width greater than that of the through hole 321. As such, the hitting plate 62 is able to abut against an inner surface of the bottom cover 32 and is limited from passing through the through hole 321. The impact unit 6 is movable upward and downward relative to the housing 3 between an impacting position, where the impact unit 6 moves upwardly and impacts the clamp unit 41, and a non-impacting position, where the impact unit 6 moves downward and away from the clamp unit 41. When the impact unit 6 is in the non-impacting position, the hitting plate 62 can abut against the inner surface of the bottom cover 32.

Referring back to FIG. 1, during assembly of the piezoelectric energy harvesting apparatuses 2, the wave-confronting surface 801 of the coastal embankment 800 is first drilled for forming a plurality of mounting grooves 802 inside the coastal embankment 800. Afterwards, the piezoelectric energy harvesting apparatuses 2 are respectively mounted in the mounting grooves 802 and are partially exposed from the wave-confronting surface 801. The piezoelectric energy harvesting apparatuses 2 are electrically coupled to the power storage device (not shown) through the conductive wires 400 disposed within the coastal embankment 800.

Referring back to FIGS. 5 to 7, after installation of the piezoelectric energy harvesting apparatuses 2, when the ocean waves 900 reach the wave-confronting surface 801 and impact the impact receiving member 61 of the impact unit 6 of each piezoelectric energy harvesting apparatus 2, the impact unit 6 moves with respect to the housing 3 to the impacting position. The hitting plate 62 impacts the clamp unit 41, such that the clamp unit 41 and the inner wall of the housing 3 compress the resilient member 5 therebetween. As the ocean waves 900 recede, the impact unit 6 moves downward to the non-impacting position by gravity force because the upward force of the ocean waves 900 disappears. When the impact unit 6 stops impacting the clamp unit 41, the resilient member 5 restores to its original position by expanding downward in an oscillating manner. Because the piezoelectric module 4 is resiliently hanged on the resilient member 5, the oscillation movement of the resilient member 5 can directly move the piezoelectric module 4 to oscillate harmonically. In practice, by adjusting the resilience of the resilient member 5, the frequency of the harmonic oscillation generated from the resilient member 5 may be adjusted to conform to the resonance frequency of the piezoelectric wafer units 42, so that the piezoelectric wafers 421 generate electricity through a piezoelectric effect until the resilient member 5 stops oscillating. During oscillation of each piezoelectric wafer unit 42, the electric power generated by the piezoelectric wafer 421 can be transmitted to the power storage device through the electric power output electrodes 422 and the conductive wires 400.

When the ocean waves 900 impact once again the impact unit 6 of each piezoelectric energy harvesting apparatus 2, the impact unit 6 pushes again the clamp unit 41 against the resilient member 5 such that the resilient member 5 generates the oscillation movement, which causes oscillation of the piezoelectric wafer units 42 for generating the electric power. By virtue of repeated impacts of the ocean waves on the impact unit 6, each piezoelectric energy harvesting apparatus 2 can continuously generate the electric power.

While in this embodiment, each piezoelectric energy harvesting apparatus 2 uses the ocean wave energy to generate the electric power, it may also use wind energy to generate the electric power.

In an alternative embodiment, the clamp unit 41 includes only two clamping rings 411 coupled to each other to clamp therebetween only one piezoelectric wafer unit 42 to generate the electric power.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A piezoelectric energy harvesting apparatus, comprising:
a housing defining an installation space;
a piezoelectric module disposed in said installation space, and including
at least one piezoelectric unit including a piezoelectric wafer, and two electric power output electrodes respectively and electrically coated on two opposite surfaces of said piezoelectric wafer, and
a clamp unit clamping said at least one piezoelectric unit and movably disposed inside said installation space;
a resilient member connected between said clamp unit and an inner wall of said housing within said installation space, said resilient member being directly connected to and resiliently hanging said clamp unit to transmit an oscillation movement to said clamp unit, which in turn causes oscillation of said piezoelectric unit for generating an electric power; and
an impact unit movably extending into said installation space, disposed beneath said piezoelectric module, and partially exposed from said housing, said impact unit being movable upwardly to directly push said piezoelectric module against said resilient member when an upward ambient natural force acts on said impact unit, such that said resilient member generates the oscillation movement, said impact unit being movable downwardly and away from said piezoelectric module by gravity to allow said piezoelectric module to move downwardly when no upward ambient natural force acts on said impact unit.

2. The piezoelectric energy harvesting apparatus as claimed in claim 1, wherein:
said clamp unit allows said piezoelectric unit to oscillate; and
said resilient member is compressible and extendable between said inner wall of said housing and said clamp unit to transmit the oscillation movement to said clamp unit thereby causing oscillation of said piezoelectric unit.

3. The piezoelectric energy harvesting apparatus as claimed in claim 2, wherein said resilient member is a helical spring.

4. The piezoelectric energy harvesting apparatus as claimed in claim 1, wherein:
said housing has a through hole formed in said bottom of said housing and communicating with said installation space; and
said impact unit includes an impact receiving member extending movably into said through hole, and a hitting plate that is fixed on top of said impact receiving member for hitting said clamp unit, said hitting plate having a width greater than that of said through hole.

5. The piezoelectric energy harvesting apparatus as claimed in claim 4, wherein said impact receiving member has a spindle portion and an impact receiving plate, said spindle portion extending movably through said through hole, said impact receiving plate radially and outwardly extending from a bottom end of said spindle portion.

6. The piezoelectric energy harvesting apparatus as claimed in claim 1, wherein said clamp unit includes two clamping rings coupled to each other to clamp therebetween said at least one piezoelectric unit, said clamping rings cooperatively defining an annular clamping recess therebetween to receive and position said at least one piezoelectric unit.

7. The piezoelectric energy harvesting apparatus as claimed in claim 1, said at least one piezoelectric unit includes a plurality of piezoelectric units clamped by said clamp unit.

8. The piezoelectric energy harvesting apparatus as claimed in claim 7, wherein said clamp unit includes a plurality of clamping rings stacked on each other, each of said piezoelectric units being clamped between each two adjacent ones of said clamp rings, said each two adjacent ones of said clamping rings cooperatively defining an annular clamping recess therebetween to receive and position one of said piezoelectric units.

* * * * *